(12) United States Patent
Oobuchi et al.

(10) Patent No.: US 7,091,147 B2
(45) Date of Patent: Aug. 15, 2006

(54) DIELECTRIC COMPOSITIONS FOR FIRING AT LOW TEMPERATURES AND ELECTRONIC PARTS

(75) Inventors: Takeshi Oobuchi, Saku (JP); Tadashi Otagiri, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 37 days.

(21) Appl. No.: 10/787,855

(22) Filed: Feb. 26, 2004

(65) Prior Publication Data

US 2004/0176240 A1    Sep. 9, 2004

(51) Int. Cl.
  *C04B 35/468*    (2006.01)
(52) U.S. Cl. ..................................... 501/139
(58) Field of Classification Search .............. 501/139
  See application file for complete search history.

(56) References Cited

U.S. PATENT DOCUMENTS

| | | | | |
|---|---|---|---|---|
| 5,264,403 A * | 11/1993 | Abe et al. | ............. | 501/139 |
| 5,292,694 A | 3/1994 | Abe et al. | | |
| 5,304,521 A * | 4/1994 | Abe et al. | ............. | 501/139 |
| 5,350,721 A * | 9/1994 | Abe et al. | ............. | 501/139 |
| 5,479,140 A * | 12/1995 | Abe et al. | ............. | 333/202 |
| 5,485,132 A * | 1/1996 | Abe et al. | ............. | 333/219 |
| 5,488,019 A * | 1/1996 | Abe et al. | ............. | 501/139 |
| 5,493,262 A | 2/1996 | Abe et al. | | |
| 5,827,792 A * | 10/1998 | Fukuda et al. | ............. | 501/138 |
| 6,107,228 A * | 8/2000 | Sugimoto et al. | ............. | 501/139 |
| 6,740,614 B1 * | 5/2004 | Kim et al. | ............. | 501/139 |

FOREIGN PATENT DOCUMENTS

| | | | |
|---|---|---|---|
| JP | 05-319922 A1 | | 12/1993 |
| JP | 8-239263 | * | 9/1996 |
| JP | 2786977 | | 5/1998 |
| JP | 2000-86337 | * | 3/2000 |

* cited by examiner

*Primary Examiner*—Karl Group
(74) *Attorney, Agent, or Firm*—Burr & Brown

(57) ABSTRACT

A dielectric composition for firing at a low temperature having a high dielectric constant $\epsilon r$, a high Q value, and a low temperature coefficient $\tau f$ of the resonance frequency is provided. The dielectric composition includes a main composition of $x.BaO\text{-}y.TiO_2\text{-}z1.Nd_2O_3\text{-}z2.La_2O_3\text{-}z3.Sm_2O_3\text{-}t.Bi_2O_3$, ($x+y+z1+z2+z3+t=1$, $0.070 \leq x \leq 0.300$, $0.385 \leq y \leq 0.844$, $0.010 \leq z1 \leq 0.130$, $0.000 \leq z2 \leq 0.120$, $0.000 \leq z3 \leq 0.120$, and $0.075 < t \leq 0.185$). The dielectric composition also includes a glass component containing at least 0.1 weight percent or more of $B_2O_3$ in an amount of 0.05 to 20 weight parts with respect to 100 weight parts of the main composition.

30 Claims, No Drawings

DIELECTRIC COMPOSITIONS FOR FIRING AT LOW TEMPERATURES AND ELECTRONIC PARTS

This application claims the benefits of Japanese Patent Applications P2003-56718, filed on Mar. 4, 2003, and 2003-420051, filed on Dec. 17, 2003, the entireties of which are incorporated by reference.

BACKGROUND OF THE INVENTION

1. Field of the Invention

The present invention relates to a low temperature-fired porcelain having a high dielectric constant $\epsilon r$ and to an electronic part using such porcelain.

2. Related Art Statement

In high frequency circuit radio instruments such as cellular phones, top filters, interstage filters, local filters, etc. are used as high frequency circuit filters, and a laminated type dielectric filter is used as an interstage filter.

In order to produce a dielectric-laminated filter, a plurality of green sheets are produced from a powdery ceramic material to constitute a dielectric, and a given electrode pattern is formed on each of the green sheets by printing with a given conductive paste. A laminate is then obtained by laminating the resulting green sheets, and the laminate is fired so that the conductive paste layers and the green sheets are simultaneously fired to densify the laminate.

At that time, a metallic conductor having a low melting point, such as a silver-based conductor, a copper-based conductor or a nickel-based conductor is generally used for the electrode. The melting points are, for example, 1100° C. or lower. Ag has a melting point of about 950 to 960° C. For this reason, the dielectric needs to be sintered at a firing temperature lower than the melting point of the metal constituting the electrode.

The assignee has disclosed a dielectric composition for firing at a low temperature in Japanese patent publication H5-319922A.

It has recently been demanded to further miniaturize electronic parts and thus to further improve the dielectric constant $\epsilon r$ of a dielectric porcelain composition. For example, the lower limit of dimensions of a dielectric laminate filter obtainable is 2.0 mm×1.25 mm when the dielectric composition having a dielectric constant of 80. When a dielectric porcelain composition having a dielectric constant of 110 or higher is used, the lower limits of the dimensions of the filter can be reduced to 1.6 mm×0.8 mm.

An object of the present invention is to provide a dielectric composition for firing at a low temperature having a high dielectric constant $\epsilon r$, a high Q value, and a low temperature coefficient $\tau f$ of resonance frequency.

SUMMARY OF THE INVENTION

According to a first aspect of the present invention, a dielectric composition for firing at low temperatures is provided, comprising a main composition of $x.BaO\text{-}y.TiO_2\text{-}z1.Nd_2O_3\text{-}z2.La_2O_3\text{-}z3.Sm_2O_3\text{-}t.Bi_2O_3$, wherein $x+y+z1+z2+z3+t=1$, $0.070 \leq x \leq 0.300$, $0.385 \leq y \leq 0.844$, $0.010 \leq z1 \leq 0.130$, $0.000 \leq z2 \leq 0.120$, $0.000 \leq z3 \leq 0.120$, and $0.075 < t \leq 0.185$). The dielectric composition also includes a glass component containing at least 0.1 weight percent of $B_2O_3$ in an amount of 0.05 to 20 weight parts with respect to 100 weight parts of the main composition.

According to a second aspect of the present invention, a dielectric composition for firing at low temperatures is provided, comprising a main composition of $x.BaO\text{-}y.TiO_2\text{-}z1.Nd_2O_3\text{-}z2.La_2O_3\text{-}z3.Sm_2O_3\text{-}t.Bi_2O_3$, wherein $x+y+z1+z2+z3+t=1$, $0.070 \leq x \leq 0.300$, $0.385 \leq y \leq 0.844$, $0.010 \leq z1 \leq 0.130$, $0.000 \leq z2 \leq 0.120$, $0.000 \leq z3 \leq 0.120$, and $0.075 < t \leq 0.185$. The dielectric composition also includes $B_2O_3$ in an amount of 0.05 to 10 weight parts with respect to 100 weight parts of the main composition.

The main compositions of the dielectric compositions according to the first and second aspects of the present invention are the same.

According to a third aspect of the present invention, a dielectric composition for firing at low temperatures is provided, comprising a main composition of $x.BaO\text{-}y.TiO_2\text{-}z1.Nd_2O_3\text{-}z2.La_2O_3\text{-}z3.Sm_2O_3\text{-}t.Bi_2O_3$, wherein $x+y+z1+z2+z3+t=1$, $0.100 \leq x \leq 0.250$, $0.600 \leq y \leq 0.750$, $0.010 \leq z1 \leq 0120$, $0.000 \leq z2 \leq 0.120$, $0.000 \leq z3 \leq 0.120$, $0.010 \leq (z1+z2+z3) \leq 0.120$; $0.065 \leq t \leq 0.075$, and $0.35 \leq t/(z1+z2+z3+t)$. The dielectric composition also includes a glass component containing at least 0.1 weight percent of $B_2O_3$ in an amount of 0.05 to 20 weight parts with respect to 100 weight parts of the main composition.

According to a fourth aspect of the present invention, a dielectric composition for firing at low temperatures is provided comprising a main composition of $x.BaO\text{-}y.TiO_2\text{-}z1.Nd_2O_3\text{-}z2.La_2O_3\text{-}z3.Sm_2O_3\text{-}t.Bi_2O_3$, wherein $x+y+z1+z2+z3+t=1$, $0.100 \leq x \leq 0.250$, $0.600 \leq y \leq 0.750$, $0.010 \leq z1 \leq 0.20$, $0.000 \leq z2 \leq 0.120$, $0.000 \leq z3 \leq 0.120$, $0.010 \leq (z1+z2+z3) \leq 0.120$, $0.065 \leq t \leq 0.075$, and $0.35 \leq t/(z1+z2+z3+t)$. The dielectric composition also includes $B_2O_3$ in an amount of 0.05 to 10 weight parts with respect to 100 weight parts of the main composition.

The main compositions of the dielectric compositions according to the third and fourth aspects of the present invention are the same.

The present invention further provides electronic part each having a dielectric composition for firing at a low temperature according to the first to fourth aspects of the present invention.

The present invention provides a dielectric composition for firing at a low temperature having a high dielectric constant ($\epsilon r$), a high Q value, a low temperature coefficient of resonance frequency, $\tau f$, and which can be produced by firing at a low temperature. Typically, the dielectric constant $\epsilon r$ can be improved to 110 or more, Q can be improved to 200 or more, and the absolute value of $\tau f$ can be reduced to 50 or lower.

These and other objects, features and advantages of the invention will be appreciated upon reading the following description of the invention when taken in conjunction with the attached drawings, with the understanding that some modifications, variations and changes of the same could be made by the skilled person in the art.

DETAILED DESCRIPTION OF THE INVENTION

The main compositions of the dielectric compositions according to the first and second aspects of the invention are the same, and will be described as follows.

The value "x" of BaO is in a range of 0.070 to 0.300 in the main composition. The dielectric constant $\epsilon r$ can be improved by increasing "x" to 0.070 or higher. From this viewpoint, "x" is 0.070 or higher and is preferably 0.100 or higher. The "Q" value can be improved and $\tau f$ can be reduced by lowering "x" to 0.300 or lower. From this viewpoint, "x" is 0.300 or lower, and is preferably 0.250 or lower.

The value "y" of $TiO_2$ is in a range of 0.385 to 0.844 in the main composition. The "Q" value can be improved and τf can be reduced by increasing "y" to 0.385 or higher. From this viewpoint, "y" is 0.385 or higher, and is preferably 0.390 or higher. The dielectric constant εr can be improved by reducing "y" to 0.844 or lower. From this viewpoint, "y" is 0.844 or lower and is preferably 0.800 or lower.

The value "z1" of $Nd_2O_3$ is in a range of 0.010 to 0.130. The dielectric constant εr can be improved by adjusting "z1" at a value in a range of 0.010 to 0.130. From this viewpoint, "z1" is preferably 0.030 or higher and is 0.130 or lower.

The value "t" of $Bi_2O_3$ is in a range of 0.075 to 0.185 in the main composition. The dielectric constant εr can be improved by increasing "x" to a value exceeding 0.075. From this viewpoint, "t" is preferably 0.0751 or higher and more preferably, 0.076 or higher. Further, the "Q" value can be improved and τf can be reduced by lowering "t" to 0.185 or lower. From this viewpoint, "t" is 0.185 or lower, and is preferably 0.160 or lower.

The value "z2" of $La_2O_3$ is 0.120 or lower. The dielectric constant εr can be further improved by adding $La_2O_3$. Further, the "Q" value can be improved and τf can be reduced by lowering "z2" to 0.120 or lower. From this viewpoint, "z2" is 0.120 or lower, and is preferably be 0.100 or lower.

The value "z3" of $Sm_2O_3$ is 0.120 or lower. The dielectric constant εr and the "Q" value can be improved and τf can be reduced by adding $Sm_2O_3$ in an amount of 0.120 or lower. From this viewpoint, "z3" is 0.120 or lower, and is preferably 0.100 or lower.

The main compositions of the dielectric compositions according to third and fourth aspects of the invention are the same, and will be described as follows.

The value "x" of BaO is in a range of 0.100 to 0.250 in the main composition. The dielectric constant εr can be improved by increasing "x" to 0.100 or higher. From this viewpoint, "x" is preferably 0.150 or higher. The "Q" value can be improved and τf can be reduced by lowering "x" to 0.250 or lower. From this viewpoint, "x" is preferably 0.200 or lower.

The value "y" of $TiO_2$ is in a range of 0.600 to 0.750 in the main composition. The "Q" value can be improved and τf can be reduced by increasing "y" to 0.600 or higher. From this viewpoint, "y" is preferably 0.640 or higher. The dielectric constant εr can be improved by reducing "y" to 0.750 or lower. From this viewpoint, "y" is preferably 0.720 or lower.

The value "z1" of $Nd_2O_3$ is in a range of 0.010 to 0.120 or lower. The dielectric constant εr can be improved by reducing "z1" to 0.120 or lower. τf can be reduced by increasing "z1" to 0.010 or higher. The value of "z1" is preferably be 0.030 or higher.

The value "z2" of $La_2O_3$ is 0.120 or lower. The dielectric constant εr can be further improved by adding $La_2O_3$. The "Q" value can be improved and τf can be reduced by reducing "z2" to 0.120 or lower.

The value "z3" of $Sm_2O_3$ is 0.120 or lower. The "Q" value and the dielectric constant εr can be improved and τf can be reduced by adding $Sm_2O_3$ in an amount of 0.120 or lower.

The value of (z1+z2+z3) is in a range of 0.010 to 0.120, so that the dielectric constant εr can be improved.

The value "t" of $Bi_2O_3$ is in a range of 0.065 to 0.075 in the main composition according to the third and fourth aspects of the present invention. It has been found that the dielectric constant εr can be improved only when the value of t/(z1+z2+z3+t) is 0.35 or higher, provided that "t" is 0.075 or lower. It has further been found that the Q value is lowered when "t" is lower than 0.065, provided that the value of t/(z1+z2+z3+t) is 0.35 or higher. It has also been found that the dielectric constant εr is reduced when the value of t/(z1+z2+z3+t) is lower than 0.35, provided that "t" is in a range of 0.065 to 0.075.

In the dielectric compositions according to the first and third aspects of the present invention, a glass component containing 0.1 weight percent or more of $B_2O_3$ is mixed with the main composition in an amount of 0.05 to 20 weight parts with respect to 100 weight parts of the main composition. The porcelain can be obtained by sintering at a low temperature by adding 0.1 weight percent or more of $B_2O_3$ into the glass component.

The content of the glass component is 0.05 weight parts or higher, so that the dielectric constant εr of the porcelain can be further improved. From this viewpoint, the content of the glass component is made 0.05 weight parts or higher and is preferably 0.10 weight parts or higher. Further, the dielectric constant εr can be improved by reducing the content of the glass component to 20.0 weight parts or lower. From this viewpoint, the content of the glass component is 20.00 weight parts or lower, and is preferably 15.00 weight parts or lower.

The glass component is not particularly limited and is preferably one or more of the following compositions: $ZnO$—$B_2O_3$—$SiO_2$; $ZnO$—$Bi_2O_3$—$B_2O_3$—$SiO_2$; $B_2O_3$—$SiO_2$; $RO$—$B_2O_3$—$SiO_2$; $GeO_2$—$B_2O_3$; $GeO_2$—$B_2O_3$—$SiO_2$; $GeO_2$—$ZnO$—$B_2O_3$—$SiO_2$; $GeO_2$—$ZnO$—$B_2O_3$; $Li_2O$—$Al_2O_3$—$SiO_2$—$B_2O_3$; $Li_2O$—$Al_2O_3$—$SiO_2$—$ZnO$—$B_2O_3$; $RO$—$Li_2O$—$Al_2O_3$—$SiO_2$—$B_2O_3$; $RO$—$Li_2O$—$Al_2O_3$—$SiO_2$—$ZnO$—$B_2O_3$; $Re_2O$—$B_2O_3$—$SiO_2$; $Re_2O$—$B_2O_3$—$ZnO$—$SiO_2$; $Re_2O$—$RO$—$B_2O_3$—$SiO_2$; and $Re_2O$—$RO$—$B_2O_3$—$ZnO$—$SiO_2$ glass; wherein Re represents an alkali metal and R represents an alkali earth metal.

In a preferred embodiment, the glass component has a $ZnO$—$B_2O_3$—$SiO_2$ composition of k (weight %) ZnO.m (weight %) $B_2O_3$. n (weight %) $SiO_2$, wherein $10 \leq k \leq 85$, $5 \leq m \leq 50$, $2 \leq n \leq 60$ and k+m+n=100.

In the above composition, the vitrification of the composition can proceed by increasing the content (k) of ZnO to 10 weight percent or higher. From this viewpoint, "k" is 10 weight percent or higher and is preferably 20 weight percent or higher. Further, vitrifaction of the composition can proceed and the optimum firing temperature of the dielectric porcelain composition can be reduced by increasing "k" to 85 weight percent or higher. From this viewpoint, "k" is 85 weight percent or lower, and is preferably 80 weight percent or lower.

The vitrifaction of the composition can proceed and the dielectric constant εr can be improved by increasing the content (m) of $B_2O_3$ to 5 weight percent or higher. From this viewpoint, "m" is made 5 weight percent or higher, and is preferably 10 weight percent or higher. Further, Q can be reduced by lowering "m" to 50 weight percent or lower. From this viewpoint, "m" is 50 weight percent or lower, and is preferably 45 weight percent or lower.

A glass having stable properties can be produced by adding $SiO_2$ in a content "n" of 2 weight percent or higher. From this viewpoint, "n" is preferably 5 weight percent or higher. On the other hand, vitrifaction of the composition can proceed and the sintering temperature of the dielectric porcelain composition can be reduced by adding $SiO_2$ in a content "n" of 60 weight percent or lower.

In the dielectric compositions according to the second and fourth aspects of the present invention, $B_2O_3$ is added in the main composition in an amount of 0.05 weight parts to 10 weight parts with respect to 100 weight parts of the main composition. The dielectric constant εr and Q value can be improved by adding at least 0.05 weight parts $B_2O_3$. From this viewpoint, the content of $B_2O_3$ is 0.05 weight parts or higher, and is preferably 0.1 weight parts or higher. Further, the dielectric constant εr and Q value can be improved by adding $B_2O_3$ in a content of 10 weight parts or lower, and is preferably 9 weight parts or lower.

In the first to fourth aspects of the present invention, each of the values "x", "y", "z1", "z2", "z3" and "t" of the metal oxide components is a converted value of a content of each metal contained in the corresponding raw material calculated as a content of the metal oxide. The converted value of the content of each metal in a mixture of the raw materials is dependent on a mixed ratio of the raw materials. According to the present invention, the mixed ratio of the raw materials for metals is weighed using a precision balance to obtain a measured ratio, so that the converted contents are then calculated based on the measured ratio.

The main compositions and glass components of the dielectric porcelain compositions according to the first to fourth aspects of the invention have been described above. Other metal elements may be contained in the compositions.

For example, the dielectric composition may also contain at least one metal selected from the group consisting of Ag, Cu and Ni in a total amount of 5 weight percent or lower. It is thus possible to further reduce τf.

The dielectric composition may contain one or more metal oxide selected from the group consisting of CuO, $V_2O_5$ and $WO_3$. In this case, the total content of the metal oxides is preferably 0.0 to 5.0 weight percent.

The dielectric composition may further contain at least one of the oxides of Mg, Al, Si, Ca, Sc, Fe, Co, Ni, Zn, Ga, Se, Sr, Y, Zr, Nb, Mo, Ru, Hf and Mn in a total content of 5 weight percent or lower.

The materials for a metal electrode used in an electronic part according to the invention are not particularly limited. Such materials are preferably silver, copper, nickel, or the alloys of these metals, more preferably, silver or an alloy of silver, and most preferably, silver.

The types of electronic parts targeted by the first to fourth aspects of the present invention are not particularly limited, and include, for example, laminated dielectric filters, multilayered circuit boards, dielectric antennas, dielectric couplers, dielectric composite modules and bulk type dielectric filters.

The dielectric composition for firing at a low temperature may be sintered at a temperature of 1100° C. or lower, more preferably 1050° C. or lower, and most preferably, 1000° C. or lower.

The porcelains according to the first to fourth aspects of the present invention are preferably produced as follows. The starting materials for the respective metal components are mixed in a given ratio to obtain a mixed powder. The powder is then calcined at 1000 to 1400° C. to obtain a calcined powder, which is then crushed to obtain ceramic powder. Preferably, a green sheet is formed by using the ceramic powder and a glass powder composed of $SiO_2$, $B_2O_3$ and ZnO, and the green sheet are fired at 850 to 930° C. As the starting materials for the respective metallic oxide components, an oxide, a nitrate, a carbonate, a sulfate or the like of each of the metals may be used.

EXAMPLES

Experiment 1

(Production of Powder of the Main Composition)

Powdery raw materials of barium carbonate, titanium oxide, neodymium oxide, bismuth oxide, lanthanum oxide and samarium oxide each having a high purity were weighed in given ratios shown in Tables 2, 3 and 4 to obtain a mixed powder. The mixed powder was charged into a polyethylene pot with alumina medium and water was added to wet mix the powder. The thus obtained mixture was drawn from the pot, dried, and charged into an alumina crucible to calcine the mixture at various temperatures of 900 to 1270° C. for 4 hours under air to obtain a calcined body. The calcined body was crushed, charged into a polyethylene pot with zirconia medium and ground until the mean grain diameter was reduced to 0.1 to 2.0 μm measured by laser diffraction scattering method to obtain various kinds of calcined and crushed compositions.

(Production of Glass Powder)

Powdery raw materials of zinc oxide, boron oxide and silicon oxide each having a high purity were weighed according to ratios shown in Table 1 and mixed to obtain mixed powder. The mixed powder was then charged into a polyethylene pot with alumina medium and dry mixed. The thus obtained mixture was melted in a chamotte crucible, and rapidly cooled by immersion into water to proceed the vitrifaction. The thus obtained glass was charged in an alumina pot with alumina medium and then ground until the mean grain diameter was reduced to 4 μm in ethanol to obtain each glass powder shown in Table 1.

TABLE 1

| Glass Composition No. | ZnO | $B_2O_3$ | $SiO_2$ |
|---|---|---|---|
| A1 | 0.10 | 0.45 | 0.45 |
| A2 | 0.20 | 0.40 | 0.40 |
| A3 | 0.50 | 0.29 | 0.21 |
| A4 | 0.70 | 0.15 | 0.15 |
| A5 | 0.80 | 0.10 | 0.10 |
| A6 | 0.85 | 0.05 | 0.10 |
| A7 | 0.60 | 0.05 | 0.35 |
| A8 | 0.40 | 0.10 | 0.50 |
| A9 | 0.20 | 0.20 | 0.60 |
| A10 | 0.35 | 0.30 | 0.35 |
| A11 | 0.15 | 0.45 | 0.40 |
| A12 | 0.20 | 0.50 | 0.30 |
| A13 | 0.75 | 0.23 | 0.02 |
| A14 | 0.45 | 0.50 | 0.05 |
| A15 | 0.30 | 0.40 | 0.30 |
| A16 | 0.30 | 0.20 | 0.50 |
| A17 | 0.25 | 0.20 | 0.55 |
| A18 | 0.35 | 0.05 | 0.60 |

(Production of Porcelain)

The main composition powder and glass powder described above were formulated as shown in Tables 2 to 4. The formulates were charged in a polyethylene pot with alumina medium and water was added for wet mixing. 1 weight percent of polyvinyl alcohol was added to the mixture as a binder to the mixture with respect to a total weight of the powder of the main component and glass powder. The thus obtained mixture was dried and passed through a sieve having a mesh diameter of 355 μm and granulated. The "Glass Contents" shown in Tables 2, 3 and 4 were the contents of the glass component with respect to 100 weight parts of the main composition.

The thus obtained granulated powder was shaped using a press molding machine at a bearing stress of 1 ton/cm² to obtain a disk shaped test piece having a diameter φ of 20 mm and a thickness of 15 mm. The thus obtained test piece was sintered for 2 hours at 900° C. in air to produce various samples of the dielectric porcelains. Further, the thus sintered samples were ground to a disk having a diameter φ of 16 mm and a thickness of 8 mm, and the dielectric properties were measured. The dielectric constant (εr) and Q were measured by parallel conductor type dielectric resonator method, and the temperature coefficient (τf) of resonance frequency was measured in a range of −25° C. to 75° C. The measurements were performed at a frequency of 2 to 4 GHz. The results were shown in Tables 2, 3 and 4.

TABLE 2

| Main composition No. | x: BaO | y: TiO2 | z1: Nd2O3 | t: Bi2O3 | z2: La2O3 | z3: Sm2O3 | Glass Composition No. | Content of glass | εr | Q (at 3 GHz) | τf |
|---|---|---|---|---|---|---|---|---|---|---|---|
| B1  | 0.050 | 0.797 | 0.063 | 0.090 | 0.000 | 0.000 | A3 | 2.5 wt % | 108 | 357 | 36 |
| B2  | 0.070 | 0.800 | 0.053 | 0.077 | 0.000 | 0.000 | A3 | 2.5 wt % | 110 | 405 | 28 |
| B3  | 0.100 | 0.752 | 0.070 | 0.078 | 0.000 | 0.000 | A3 | 2.5 wt % | 113 | 380 | 30 |
| B4  | 0.200 | 0.660 | 0.060 | 0.080 | 0.000 | 0.000 | A3 | 2.5 wt % | 124 | 242 | 37 |
| B5  | 0.250 | 0.620 | 0.051 | 0.079 | 0.000 | 0.000 | A3 | 2.5 wt % | 128 | 236 | 39 |
| B6  | 0.300 | 0.600 | 0.024 | 0.076 | 0.000 | 0.000 | A3 | 2.5 wt % | 130 | 230 | 41 |
| B7  | 0.320 | 0.584 | 0.020 | 0.076 | 0.000 | 0.000 | A3 | 2.5 wt % | 150 | 124 | 256 |
| B8  | 0.423 | 0.380 | 0.097 | 0.100 | 0.000 | 0.000 | A3 | 2.5 wt % | 149 | 153 | 67 |
| B9  | 0.300 | 0.385 | 0.130 | 0.185 | 0.000 | 0.000 | A3 | 2.5 wt % | 143 | 205 | 48 |
| B10 | 0.300 | 0.390 | 0.130 | 0.180 | 0.000 | 0.000 | A3 | 2.5 wt % | 141 | 209 | 47 |
| B11 | 0.146 | 0.584 | 0.120 | 0.150 | 0.000 | 0.000 | A3 | 2.5 wt % | 135 | 221 | 44 |
| B12 | 0.200 | 0.600 | 0.110 | 0.090 | 0.000 | 0.000 | A3 | 2.5 wt % | 136 | 218 | 46 |
| B13 | 0.120 | 0.750 | 0.050 | 0.080 | 0.000 | 0.000 | A3 | 2.5 wt % | 118 | 310 | 33 |
| B14 | 0.071 | 0.800 | 0.053 | 0.076 | 0.000 | 0.000 | A3 | 2.5 wt % | 111 | 409 | 29 |
| B15 | 0.070 | 0.844 | 0.011 | 0.075 | 0.000 | 0.000 | A3 | 2.5 wt % | 110 | 410 | 28 |
| B16 | 0.064 | 0.850 | 0.010 | 0.076 | 0.000 | 0.000 | A3 | 2.5 wt % | 89  | 430 | 25 |

TABLE 3

| Main Composition No. | x: BaO | y: TiO2 | z1: Nd2O3 | t: Bi2O3 | z2: La2O3 | z3: Sm2O3 | Glass Composition No. | Content of Glass | εr | Q (at 3 GHz) | τf |
|---|---|---|---|---|---|---|---|---|---|---|---|
| B17 | 0.194 | 0.724 | 0.005  | 0.077  | 0.000 | 0.000 | A3 | 2.5 wt % | 113 | 175 | 63 |
| B18 | 0.180 | 0.700 | 0.010  | 0.110  | 0.000 | 0.000 | A3 | 2.5 wt % | 126 | 238 | 39 |
| B19 | 0141  | 0.750 | 0.030  | 0.079  | 0.000 | 0.000 | A3 | 2.5 wt % | 120 | 249 | 35 |
| B20 | 0.170 | 0.684 | 0.070  | 0.076  | 0.000 | 0.000 | A3 | 2.5 wt % | 123 | 245 | 37 |
| B21 | 0.170 | 0.570 | 0.110  | 0.150  | 0.000 | 0.000 | A3 | 2.5 wt % | 132 | 226 | 42 |
| B22 | 0.190 | 0.600 | 0.130  | 0.080  | 0.000 | 0.000 | A3 | 2.5 wt % | 124 | 242 | 37 |
| B23 | 0.153 | 0.623 | 0.140  | 0.084  | 0.000 | 0.000 | A3 | 2.5 wt % | 106 | 262 | 29 |
| B25 | 0160  | 0.695 | 0.0698 | 0.0752 | 0.000 | 0.000 | A3 | 2.5 wt % | 110 | 300 | 28 |
| B26 | 0.160 | 0.695 | 0.0695 | 0.0755 | 0.000 | 0.000 | A3 | 2.5 wt % | 115 | 28  | 30 |
| B27 | 0.160 | 0.695 | 0.069  | 0.076  | 0.000 | 0.000 | A3 | 2.5 wt % | 120 | 260 | 34 |
| B28 | 0.180 | 0.660 | 0.083  | 0.077  | 0.000 | 0.000 | A3 | 2.5 wt % | 122 | 247 | 36 |
| B29 | 0.171 | 0.640 | 0.089  | 0.100  | 0.000 | 0.000 | A3 | 2.5 wt % | 134 | 222 | 43 |
| B30 | 0.170 | 0.580 | 0.090  | 0.160  | 0.000 | 0.000 | A3 | 2.5 wt % | 142 | 208 | 48 |
| B31 | 0.165 | 0.600 | 0.050  | 0.185  | 0.000 | 0.000 | A3 | 2.5 wt % | 143 | 205 | 49 |
| B32 | 0.154 | 0.580 | 0.076  | 0.190  | 0.000 | 0.000 | A3 | 2.5 wt % | 147 | 183 | 58 |

TABLE 4

| Main Composition No. | x: BaO | y: TiO2 | z1: Nd2O3 | t: Bi2O3 | z2: La2O3 | z3: Sm2O3 | Glass Composition No. | Content of Glass | εr | Q (at 3 GHz) | τf |
|---|---|---|---|---|---|---|---|---|---|---|---|
| B33 | 0.150 | 0.720 | 0.030 | 0.090 | 0.000 | 0.010 | A3 | 2.5 wt % | 129 | 232 | 41 |
| B34 | 0.140 | 0.690 | 0.040 | 0.100 | 0.020 | 0.010 | A3 | 2.5 wt % | 128 | 234 | 42 |
| B35 | 0.170 | 0.660 | 0.020 | 0.080 | 0.050 | 0.020 | A3 | 2.5 wt % | 132 | 225 | 42 |
| B36 | 0.160 | 0.570 | 0.040 | 0.080 | 0.100 | 0.050 | A3 | 2.5 wt % | 132 | 225 | 42 |
| B37 | 0.200 | 0.490 | 0.030 | 0.100 | 0.120 | 0.060 | A3 | 2.5 wt % | 142 | 208 | 47 |
| B38 | 0.125 | 0.537 | 0.052 | 0.076 | 0.140 | 0.070 | A3 | 2.5 wt % | 151 | 126 | 89 |
| B39 | 0.120 | 0.680 | 0.090 | 0.100 | 0.010 | 0.000 | A3 | 2.5 wt % | 118 | 310 | 33 |
| B40 | 0.170 | 0.590 | 0.080 | 0.130 | 0.010 | 0.020 | A3 | 2.5 wt % | 140 | 211 | 48 |
| B41 | 0.180 | 0.600 | 0.050 | 0.090 | 0.030 | 0.050 | A3 | 2.5 wt % | 128 | 245 | 40 |
| B42 | 0.090 | 0.610 | 0.030 | 0.100 | 0.070 | 0.100 | A3 | 2.5 wt % | 118 | 305 | 33 |
| B43 | 0.070 | 0.550 | 0.040 | 0.120 | 0.100 | 0.120 | A3 | 2.5 wt % | 129 | 239 | 40 |
| B44 | 0.120 | 0.495 | 0.096 | 0.079 | 0.070 | 0.140 | A3 | 2.5 wt % | 105 | 290 | 39 |

As shown in Table 2, the dielectric constant εr can be improved by increasing the value "x" of BaO to 0.070 or higher. Further, the Q value can be improved and τf can be reduced by lowering "x" to 0.300 or lower.

As shown in Table 2, the Q value can be improved and τf can be reduced by increasing the value "y" of $TiO_2$ to 0.385 or higher. Further the dielectric constant εr can be improved by reducing "y" to 0.844 or lower.

As shown in Table 3, the dielectric constant εr can be improved by increasing the value "z1" of $Nd_2O_3$ to 0.010 to 0.130.

As shown in Table 3, the dielectric constant εr can be improved by increasing the value "t" of $Bi_2O_3$ to a value exceeding 0.075. Further the Q value can be improved and τf can be reduced by lowering "t" to 0.185 or lower.

As shown in Table 4, the dielectric constant εr can be further improved by adding $La_2O_3$. Further, the Q value can be improved and τf can be reduced by reducing "z2" to 0.120 or lower.

As shown in Table 4, the dielectric constant εr and the Q value can be improved and τf can be reduced by adding $Sm_2O_3$ in an amount of 0.120 or lower.

Experiment 2

Porcelains were produced according to the same process as Experiment 1 and the properties were measured as in Experiment 1. Compositions A1 to A18 of the glass components are shown in Table 1. The ratios of the metal elements and glass compositions are shown in Tables 5 and 6. The results obtained by using the glass compositions A1 to A14 are shown in Table 5, and the results obtained by using the glass compositions A15 to A18 are shown in Table 6.

TABLE 5

| Main Composition No. | x: BaO | y: TiO2 | z1: Nd2O3 | t: Bi2O3 | z2: La2O3 | z3: Sm2O3 | Glass Composition No. | Content of Glass | εr | Q (at 3 GHz) | τf |
|---|---|---|---|---|---|---|---|---|---|---|---|
| B4 | 0.200 | 0.660 | 0.060 | 0.080 | 0.000 | 0.000 | A1 | 2.5 wt % | 128 | 232 | 40 |
| B12 | 0.200 | 0.600 | 0.110 | 0.090 | 0.000 | 0.000 | A2 | 2.5 wt % | 130 | 230 | 41 |
| B20 | 0.170 | 0.684 | 0.070 | 0.076 | 0.000 | 0.000 | A3 | 2.5 wt % | 123 | 245 | 37 |
| B28 | 0.180 | 0.660 | 0.085 | 0.075 | 0.000 | 0.000 | A4 | 2.5 wt % | 122 | 245 | 40 |
| B35 | 0.170 | 0.660 | 0.020 | 0.080 | 0.050 | 0.020 | A5 | 2.5 wt % | 125 | 242 | 39 |
| B41 | 0.180 | 0.600 | 0.050 | 0.090 | 0.030 | 0.050 | A6 | 2.5 wt % | 129 | 234 | 40 |
| B4 | 0.200 | 0.660 | 0.060 | 0.080 | 0.000 | 0.000 | A7 | 2.5 wt % | 125 | 245 | 38 |
| B12 | 0.200 | 0.600 | 0.110 | 0.090 | 0.000 | 0.000 | A8 | 2.5 wt % | 124 | 243 | 37 |
| B20 | 0170 | 0.684 | 0.070 | 0.076 | 0.000 | 0.000 | A9 | 2.5 wt % | 122 | 246 | 37 |
| B28 | 0.180 | 0.660 | 0.085 | 0.075 | 0.000 | 0.000 | A10 | 2.5 wt % | 123 | 244 | 37 |
| B35 | 0.170 | 0.660 | 0.020 | 0.080 | 0.050 | 0.020 | A11 | 2.5 wt % | 125 | 241 | 38 |
| B41 | 0.180 | 0.600 | 0.050 | 0.090 | 0.030 | 0.050 | A12 | 2.5 wt % | 124 | 242 | 37 |
| B4 | 0.200 | 0.660 | 0.060 | 0.080 | 0.000 | 0.000 | A13 | 2.5 wt % | 124 | 243 | 38 |
| B12 | 0.200 | 0.600 | 0.110 | 0.090 | 0.000 | 0.000 | A14 | 2.5 wt % | 126 | 238 | 39 |

TABLE 6

| Main Composition No. | x: BaO | y: TiO2 | z1: Nd2O3 | t: Bi2O3 | z2: La2O3 | z3: Sm2O3 | Glass Composition No. | Content of Glass | εr | Q (at 3 GHz) | τf |
|---|---|---|---|---|---|---|---|---|---|---|---|
| B20 | 0.170 | 0.684 | 0.070 | 0.076 | 0.000 | 0.000 | A15 | 2.5 wt % | 124 | 242 | 37 |
| B28 | 0.180 | 0.660 | 0.085 | 0.075 | 0.000 | 0.000 | A16 | 2.5 wt % | 122 | 252 | 36 |
| B35 | 0.170 | 0.660 | 0.020 | 0.080 | 0.050 | 0.020 | A17 | 2.5 wt % | 121 | 248 | 37 |
| B41 | 0.180 | 0.600 | 0.050 | 0.090 | 0.030 | 0.050 | A18 | 2.5 wt % | 120 | 250 | 34 |
| B20 | 0.170 | 0.684 | 0.070 | 0.076 | 0.000 | 0.000 | A3 | 0.01 wt % | 82 | 120 | 59 |
| B20 | 0.170 | 0.684 | 0.070 | 0.076 | 0.000 | 0.000 | A3 | 0.05 wt % | 115 | 330 | 31 |
| B20 | 0.170 | 0.684 | 0.070 | 0.076 | 0.000 | 0.000 | A3 | 0.10 wt % | 118 | 295 | 34 |
| B20 | 0.170 | 0.684 | 0.070 | 0.076 | 0.000 | 0.000 | A3 | 1.00 wt % | 120 | 248 | 35 |
| B20 | 0.170 | 0.684 | 0.070 | 0.076 | 0.000 | 0.000 | A3 | 2.50 wt % | 123 | 245 | 37 |
| B20 | 0.170 | 0.684 | 0.070 | 0.076 | 0.000 | 0.000 | A3 | 5.00 wt % | 123 | 246 | 38 |
| B20 | 0.170 | 0.684 | 0.070 | 0.076 | 0.000 | 0.000 | A3 | 10.00 wt % | 120 | 245 | 36 |
| B20 | 0.170 | 0.684 | 0.070 | 0.076 | 0.000 | 0.000 | A3 | 15.00 wt % | 115 | 329 | 33 |
| B20 | 0.170 | 0.684 | 0.070 | 0.076 | 0.000 | 0.000 | A3 | 20.00 wt % | 110 | 290 | 29 |
| B20 | 0.170 | 0.684 | 0.070 | 0.076 | 0.000 | 0.000 | A3 | 25.00 wt % | 91 | 200 | 31 |

As can be seen from Tables 5 and 6, the dielectric constant εr and Q values can be improved and τf can be reduced by using the glass compositions according to the present invention.

Experiment 3

Porcelains were produced according to the same process as in Experiment 1 and the properties were measured as in Experiment 1. The glass composition A3 was used and the ratio of the ingredients was changed as shown in Table 6. As can be seen from the results, the dielectric constant εr and Q values can be improved and τf can be reduced by adjusting the glass content to 0.05 to 20.00 weight percent.

Experiment 4

Porcelains were produced according to the same process as in Experiment 1 and the properties were measured as in Experiment 1. The glass composition was changed as shown in Table 7 and the ratio of metal oxides and glass composition were changed as shown in Table 8. As can be seen from the results, the dielectric constant εr and Q values can be improved and τf can be reduced in a range of the present invention.

TABLE 7

| Composition No. | Composition system |
| --- | --- |
| A19 | ZnO—B2O3—SiO2 glass |
| A20 | ZnO—Bi2O3—B2O3—SiO2 glass |
| A21 | B2O3—SiO2 glass |
| A22 | RO—B2O3—SiO2 glass (R represents an alkali earth metal) |
| A23 | GeO2—B2O3 glass |
| A24 | GeO2—B2O3—SiO2 glass |
| A25 | GeO2—ZnO—B2O3—SiO2 glass |
| A26 | GeO2—ZnO—B2O3 glass |
| A27 | Li2O—Al2O3—SiO3—B2O3 glass |
| A28 | Li2O—Al2O3—SiO3—ZnO—B2O3 glass |
| A29 | RO—Li2O—Al2O3—SiO3—B2O3 glass (R represents an alkali earth metal) |
| A30 | RO—Li2O—Al2O3—SiO3—ZnO—B2O3 glass (R represents an alkali earth metal) |
| A31 | Re2O—B2O3—SiO2 glass (Re represents an alkali metal) |
| A32 | Re2O—B2O3—ZnO—SiO2 glass (Re represents an alkali metal) |
| A33 | Re2O—RO—B2O3—SiO2 glass (Re represents an alkali metal: R represents an alkali earth metal) |
| A34 | Re2O—RO—B2O3—ZnO—SiO2 glass (Re represents an alkali metal; R represents an alkali earth metal) |

TABLE 8

| Main Composition No. | x: BaO | y: TiO2 | z1: Nd2O3 | t: Bi2O3 | z2: La2O3 | z3: Sm2O3 | Glass Composition No. | Content of glass | εr | Q (at 3 GHz) | τf |
| --- | --- | --- | --- | --- | --- | --- | --- | --- | --- | --- | --- |
| B20 | 0.170 | 0.684 | 0.070 | 0.076 | 0.000 | 0.000 | A19 | 2.5 wt % | 126 | 239 | 38 |
| B20 | 0.170 | 0.684 | 0.070 | 0.076 | 0.000 | 0.000 | A20 | 2.5 wt % | 124 | 243 | 36 |
| B20 | 0.170 | 0.684 | 0.070 | 0.076 | 0.000 | 0.000 | A21 | 2.5 wt % | 125 | 242 | 37 |
| B20 | 0.170 | 0.684 | 0.070 | 0.076 | 0.000 | 0.000 | A22 | 2.5 wt % | 126 | 237 | 39 |
| B20 | 0.170 | 0.684 | 0.070 | 0.076 | 0.000 | 0.000 | A23 | 2.5 wt % | 126 | 239 | 38 |
| B20 | 0.170 | 0.684 | 0.070 | 0.076 | 0.000 | 0.000 | A24 | 2.5 wt % | 123 | 248 | 36 |
| B20 | 0.170 | 0.684 | 0.070 | 0.076 | 0.000 | 0.000 | A25 | 2.5 wt % | 125 | 239 | 38 |
| B20 | 0.170 | 0.684 | 0.070 | 0.076 | 0.000 | 0.000 | A26 | 2.5 wt % | 126 | 243 | 39 |
| B20 | 0.170 | 0.684 | 0.070 | 0.076 | 0.000 | 0.000 | A27 | 2.5 wt % | 127 | 231 | 40 |
| B20 | 0.170 | 0.684 | 0.070 | 0.076 | 0.000 | 0.000 | A28 | 2.5 wt % | 129 | 230 | 40 |
| B20 | 0.170 | 0.684 | 0.070 | 0.076 | 0.000 | 0.000 | A29 | 2.5 wt % | 128 | 238 | 39 |
| B20 | 0.170 | 0.684 | 0.070 | 0.076 | 0.000 | 0.000 | A30 | 2.5 wt % | 124 | 241 | 37 |
| B20 | 0.170 | 0.684 | 0.070 | 0.076 | 0.000 | 0.000 | A31 | 2.5 wt % | 123 | 246 | 37 |
| B20 | 0.170 | 0.684 | 0.070 | 0.076 | 0.000 | 0.000 | A32 | 2.5 wt % | 125 | 240 | 37 |
| B20 | 0.170 | 0.684 | 0.070 | 0.076 | 0.000 | 0.000 | A33 | 2.5 wt % | 126 | 239 | 39 |
| B20 | 0.170 | 0.684 | 0.070 | 0.076 | 0.000 | 0.000 | A34 | 2.5 wt % | 128 | 231 | 40 |

Experiment 5

Porcelains were produced according to the same process as in Experiment 1 and the properties were measured as in Experiment 1. $Bi_2O_3$ was added as the glass component and the content was changed as shown in Table 9. The composition of the metal oxides was also changed as shown in Table 9. As a result, the dielectric constant εr and Q values can be improved and τf can be reduced by adding 0.01 weight percent or more of $Bi_2O_3$.

TABLE 9

| Main Composition No. | x: BaO | y: TiO2 | z1: Nd2O3 | t: Bi2O3 | z2: La2O3 | z3: Sm2O3 | Glass Composition No. | Content of glass | εr | Q (at 3 GHz) | τf |
| --- | --- | --- | --- | --- | --- | --- | --- | --- | --- | --- | --- |
| B20 | 0.170 | 0.684 | 0.070 | 0.076 | 0.000 | 0.000 | A3 | 0.01 wt % | 110 | 205 | 38 |
| B20 | 0.170 | 0.684 | 0.070 | 0.076 | 0.000 | 0.000 | A3 | 0.10 wt % | 116 | 212 | 39 |
| B20 | 0.170 | 0.684 | 0.070 | 0.076 | 0.000 | 0.000 | A3 | 1.00 wt % | 120 | 226 | 37 |

TABLE 9-continued

| Main Composition No. | x: BaO | y: TiO2 | z1: Nd2O3 | t: Bi2O3 | z2: La2O3 | z3: Sm2O3 | Glass Composition No. | Content of glass | εr | Q (at 3 GHz) | τf |
|---|---|---|---|---|---|---|---|---|---|---|---|
| B20 | 0.170 | 0.684 | 0.070 | 0.076 | 0.000 | 0.000 | A3 | 2.50 wt % | 126 | 239 | 38 |
| B20 | 0.170 | 0.684 | 0.070 | 0.076 | 0.000 | 0.000 | A3 | 5.00 wt % | 125 | 242 | 38 |
| B20 | 0.170 | 0.684 | 0.070 | 0.076 | 0.000 | 0.000 | A3 | 10.00 wt % | 121 | 238 | 38 |

Experiment 6

Porcelains were produced according to the same process as in Experiment 1 and the properties were measured as in Experiment 1. The glass composition A3 was used in a content of 1.5 weight percent. The ratio of metal oxides was changed as shown in Table 10. Silver, copper and nickel was added to the main component as shown in Table 10.

TABLE 10

| Main Composition No. | x: BaO | y: TiO2 | z1: Nd2O3 | t: Bi2O3 | z2: La2O3 | z3: Sm2O3 | Glass Composition | Content of glass | Additional Component | Content of Additional Component | εr | Q (at 3 GHz) | τf |
|---|---|---|---|---|---|---|---|---|---|---|---|---|---|
| B20 | 0.170 | 0.684 | 0.070 | 0.076 | 0.000 | 0.000 | A3 | 1.5 wt % | Ag | 0.0 wt % | 123 | 245 | 37 |
| B20 | 0.170 | 0.684 | 0.070 | 0.076 | 0.000 | 0.000 | A3 | 1.5 wt % | Ag | 0.5 wt % | 126 | 230 | 38 |
| B20 | 0.170 | 0.684 | 0.070 | 0.076 | 0.000 | 0.000 | A3 | 1.5 wt % | Ag | 2.5 wt % | 124 | 220 | 37 |
| B20 | 0.170 | 0.684 | 0.070 | 0.076 | 0.000 | 0.000 | A3 | 1.5 wt % | Ag | 5.0 wt % | 120 | 210 | 35 |
| B20 | 0.170 | 0.684 | 0.070 | 0.076 | 0.000 | 0.000 | A3 | 1.5 wt % | Ag | 7.5 wt % | 109 | 190 | 63 |
| B20 | 0.170 | 0.684 | 0.070 | 0.076 | 0.000 | 0.000 | A3 | 1.5 wt % | Cu | 0.0 wt % | 123 | 245 | 37 |
| B20 | 0.170 | 0.684 | 0.070 | 0.076 | 0.000 | 0.000 | A3 | 1.5 wt % | Cu | 0.5 wt % | 126 | 230 | 37 |
| B20 | 0.170 | 0.684 | 0.070 | 0.076 | 0.000 | 0.000 | A3 | 1.5 wt % | Cu | 2.5 wt % | 125 | 220 | 34 |
| B20 | 0.170 | 0.684 | 0.070 | 0.076 | 0.000 | 0.000 | A3 | 1.5 wt % | Cu | 5.0 wt % | 122 | 205 | 32 |
| B20 | 0.170 | 0.684 | 0.070 | 0.076 | 0.000 | 0.000 | A3 | 1.5 wt % | Cu | 7.5 wt % | 108 | 188 | 62 |
| B20 | 0.170 | 0.684 | 0.070 | 0.076 | 0.000 | 0.000 | A3 | 1.5 wt % | Ni | 0.0 wt % | 123 | 245 | 37 |
| B20 | 0.170 | 0.684 | 0.070 | 0.076 | 0.000 | 0.000 | A3 | 1.5 wt % | Ni | 0.5 wt % | 126 | 235 | 39 |
| B20 | 0.170 | 0.684 | 0.070 | 0.076 | 0.000 | 0.000 | A3 | 1.5 wt % | Ni | 2.5 wt % | 125 | 220 | 38 |
| B20 | 0.170 | 0.684 | 0.070 | 0.076 | 0.000 | 0.000 | A3 | 1.5 wt % | Ni | 5.0 wt % | 122 | 210 | 36 |
| B20 | 0.170 | 0.684 | 0.070 | 0.076 | 0.000 | 0.000 | A3 | 1.5 wt % | Ni | 7.5 wt % | 109 | 189 | 63 |

As a result, the dielectric constant εr and Q value can be improved and τf can be reduced when silver, copper or nickel was added to the main composition.

Experiment 7

Porcelains were produced according to the same process as in Experiment 1 and the properties were measured as Experiment 1. The glass composition A3 was used in a content of 1.5 weight percent. The ratio of metal oxides was changed as shown in Table 10. Copper oxide, vanadium oxide or tungsten oxide was added to the main component as shown in Table 11.

TABLE 11

| Main Component No. | x: BaO | y: TiO2 | z1: Nd2O3 | t: Bi2O3 | z2: La2O3 | z3: Sm2O3 | Glass Composition | Content of glass | Additional Component | Content of Additional Component | εr | Q (at 3 GHz) | τf |
|---|---|---|---|---|---|---|---|---|---|---|---|---|---|
| B20 | 0.170 | 0.684 | 0.070 | 0.076 | 0.000 | 0.000 | A3 | 1.5 wt % | CuO | 0.0 wt % | 123 | 245 | 37 |
| B20 | 0.170 | 0.684 | 0.070 | 0.076 | 0.000 | 0.000 | A3 | 1.5 wt % | CuO | 0.5 wt % | 126 | 320 | 39 |
| B20 | 0.170 | 0.684 | 0.070 | 0.076 | 0.000 | 0.000 | A3 | 1.5 wt % | CuO | 2.5 wt % | 125 | 270 | 38 |
| B20 | 0.170 | 0.684 | 0.070 | 0.076 | 0.000 | 0.000 | A3 | 1.5 wt % | CuO | 5.0 wt % | 123 | 230 | 36 |
| B20 | 0.170 | 0.684 | 0.070 | 0.076 | 0.000 | 0.000 | A3 | 1.5 wt % | CuO | 7.5 wt % | 107 | 168 | 10 |
| B20 | 0.170 | 0.684 | 0.070 | 0.076 | 0.000 | 0.000 | A3 | 1.5 wt % | V2O5 | 0.0 wt % | 123 | 245 | 37 |
| B20 | 0.170 | 0.684 | 0.070 | 0.076 | 0.000 | 0.000 | A3 | 1.5 wt % | V2O5 | 0.5 wt % | 128 | 290 | 39 |
| B20 | 0.170 | 0.684 | 0.070 | 0.076 | 0.000 | 0.000 | A3 | 1.5 wt % | V2O5 | 2.5 wt % | 126 | 250 | 39 |
| B20 | 0.170 | 0.684 | 0.070 | 0.076 | 0.000 | 0.000 | A3 | 1.5 wt % | V2O5 | 5.0 wt % | 124 | 220 | 37 |
| B20 | 0.170 | 0.684 | 0.070 | 0.076 | 0.000 | 0.000 | A3 | 1.5 wt % | V2O5 | 7.5 wt % | 105 | 143 | 68 |
| B20 | 0.170 | 0.684 | 0.070 | 0.076 | 0.000 | 0.000 | A3 | 1.5 wt % | WO3 | 0.0 wt % | 123 | 245 | 37 |
| B20 | 0.170 | 0.684 | 0.070 | 0.076 | 0.000 | 0.000 | A3 | 1.5 wt % | WO3 | 0.5 wt % | 130 | 240 | 41 |
| B20 | 0.170 | 0.684 | 0.070 | 0.076 | 0.000 | 0.000 | A3 | 1.5 wt % | WO3 | 2.5 wt % | 127 | 230 | 40 |

TABLE 11-continued

| Main Component No. | x: BaO | y: TiO2 | z1: Nd2O3 | t: Bi2O3 | z2: La2O3 | z3: Sm2O3 | Glass Composition | Content of glass | Additional Component | Content of Additional Component | $\epsilon r$ | Q (at 3 GHz) | $\tau f$ |
|---|---|---|---|---|---|---|---|---|---|---|---|---|---|
| B20 | 0.170 | 0.684 | 0.070 | 0.076 | 0.000 | 0.000 | A3 | 1.5 wt % | WO3 | 5.0 wt % | 125 | 210 | 37 |
| B20 | 0.170 | 0.684 | 0.070 | 0.076 | 0.000 | 0.000 | A3 | 1.5 wt % | WO3 | 7.5 wt % | 107 | 183 | 67 |

As a result, the dielectric constant $\epsilon r$ and Q value can be improved and $\tau f$ can be reduced when copper oxide, vanadium oxide or tungsten oxide was added to the main composition.

Experiment 8

Porcelains were produced according to the same process as in Experiment 1 and the properties were measured as in Experiment 1. The glass composition A3 was used in a content of 2.5 weight percent. The ratio of metal oxides was changed as shown in Tables 12 and 13. The results are shown in Tables 12 and 13.

can be maintained at a low value. In composition C7, the value "x" of BaO was large and the value "t" of $Bi_2O_3$ was low so that Q can be reduced. In composition C8, the value "y" of $TiO_2$ was low so that Q was lowered. In composition C9, the value "y" of $TiO_2$ was high, so that the dielectric constant $\epsilon r$ was reduced. In composition C10, the value of (z1+z2+z3) was high so that the dielectric constant $\epsilon r$ was lowered. In composition C11, the value "z1" of $Nd_2O_3$ was low so that the temperature coefficient ($\tau f$) of resonance frequency was large. In composition C12, a/(z1+z2+z3) was low and the ratio "t" of $Bi_2O_3$ was low, so that the dielectric constant $\epsilon r$ was reduced. In compositions C13 to C16, the

TABLE 12

| Main Composition No. | | x: BaO | y: TiO2 | z1: Nd2O3 | z2: La2O3 | z3: Sm2O3 | z1+z2+z3 | a | t: Bi2O3 | Glass Composition No. | Content of Glass (wt, %) | $\epsilon r$ | Q (at 3 GHz) | $\tau f$ ppm/°C. |
|---|---|---|---|---|---|---|---|---|---|---|---|---|---|---|
| C1 | Comparative Example | 0.090 | 0.750 | 0.088 | 0.000 | 0.000 | 0.088 | 0.450 | 0.072 | A3 | 2.5 | 107 | 305 | 23 |
| C2 | Example | 0.137 | 0.680 | 0.110 | 0.000 | 0.000 | 0.110 | 0.400 | 0.073 | A3 | 2.5 | 112 | 295 | 34 |
| C3 | Example | 0.176 | 0.660 | 0.090 | 0.000 | 0.000 | 0.090 | 0.450 | 0.074 | A3 | 2.5 | 126 | 278 | 38 |
| C4 | Example | 0.160 | 0.715 | 0.050 | 0.000 | 0.000 | 0.050 | 0.600 | 0.075 | A3 | 2.5 | 130 | 259 | 41 |
| C5 | Example | 0.245 | 0.657 | 0.030 | 0.000 | 0.000 | 0.030 | 0.695 | 0.068 | A3 | 2.5 | 132 | 227 | 49 |
| C6 | Example | 0.245 | 0.657 | 0.030 | 0.000 | 0.000 | 0.030 | 0.695 | 0.068 | A3 | 2.5 | 138 | 213 | 54 |
| C7 | Comparative Example | 0.260 | 0.600 | 0.080 | 0.000 | 0.000 | 0.080 | 0.427 | 0.060 | A3 | 2.5 | 123 | 190 | 60 |
| C8 | Comparative Example | 0.226 | 0.580 | 0.120 | 0.000 | 0.000 | 0.120 | 0.380 | 0.074 | A3 | 2.5 | 122 | 194 | 54 |
| C9 | Comparative Example | 0.100 | 0.770 | 0.065 | 0.000 | 0.000 | 0.065 | 0.500 | 0.065 | A3 | 2.5 | 108 | 297 | 27 |

TABLE 13

| Main Composition No. | | x: BaO | y: TiO2 | z1: Nd2O3 | z2: La2O3 | z3: Sm2O3 | z1+z2+z3 | a | t: Bi2O3 | Glass Composition No. | Content Of glass wt. % | $\epsilon r$ | Q (at 3 GHz) | $\tau f$ ppm/°C. |
|---|---|---|---|---|---|---|---|---|---|---|---|---|---|---|
| C10 | Comparative Example | 0.180 | 0.620 | 0.130 | 0.000 | 0.000 | 0.130 | 0.350 | 0.070 | A3 | 2.5 | 106 | 227 | 44 |
| C11 | Comparative Example | 0.225 | 0.704 | 0.005 | 0.000 | 0.000 | 0.005 | 0.930 | 0.066 | A3 | 2.5 | 112 | 224 | 96 |
| C12 | Comparative Example | 0.200 | 0.720 | 0.056 | 0.000 | 0.000 | 0.056 | 0.300 | 0.024 | A3 | 2.5 | 106 | 248 | 30 |
| C13 | Example | 0.116 | 0.730 | 0.080 | 0.000 | 0.000 | 0.080 | 0.480 | 0.074 | A3 | 2.5 | 112 | 282 | 28 |
| C14 | Example | 0.167 | 0.666 | 0.020 | 0.080 | 0.000 | 0.100 | 0.400 | 0.067 | A3 | 2.5 | 117 | 244 | 39 |
| C15 | Example | 0.175 | 0.650 | 0.030 | 0.000 | 0.070 | 0.100 | 0.430 | 0.075 | A3 | 2.5 | 127 | 241 | 43 |
| C16 | Example | 0.215 | 0.630 | 0.020 | 0.020 | 0.050 | 0.090 | 0.420 | 0.065 | A3 | 2.5 | 122 | 213 | 50 |
| C17 | Comparative Example | 0.205 | 0.707 | 0.000 | 0.022 | 0.000 | 0.022 | 0.750 | 0.066 | A3 | 2.5 | 124 | 237 | 72 |
| C18 | Comparative Example | 0.185 | 0.668 | 0.080 | 0.015 | 0.015 | 0.110 | 0.250 | 0.037 | A3 | 2.5 | 105 | 240 | 33 |

In the composition C1, the value "x" of BaO was low so that the dielectric constant $\epsilon r$ was reduced. In compositions C2 to C6, the dielectric constant $\epsilon r$ and Q can be improved and the temperature coefficient ($\tau f$) of resonance frequency dielectric constant $\epsilon r$ and Q can be improved and the temperature coefficient ($\tau f$) of resonance frequency can be maintained at a low value. In composition C17, the value "z1" of $Nd_2O_3$ was low so that the temperature coefficient (τf) of resonance frequency was large. In composition C18, a/(z1+z2+z3) and the ratio "t" of $Bi_2O_3$ were low, so that the dielectric constant εr was lowered.

As described above, the present invention provides a dielectric composition for firing at a low temperature having a high dielectric constant εr, a high Q value and a low temperature coefficient τf of resonance frequency.

The present invention has been explained referring to the preferred embodiments, however, the present invention is not limited to the illustrated embodiments which are given by way of examples only, and may be carried out in various modes without departing from the scope of the invention.

The invention claimed is:

1. A dielectric composition for firing at low temperatures comprising:
   a main composition of $x.BaO\text{-}y.TiO_2\text{-}z1.Nd_2O_3\text{-}z2.La_2O_3\text{-}z3.Sm_2O_3\text{-}t.Bi_2O_3$ (x+y+z1+z2+z3+t=1, $0.070 \leq x \leq 0.300$, $0.385 \leq y \leq 0.844$, $0.010 \leq z1 \leq 0.130$, $0.000 \leq z2 \leq 0.120$, $0.000 \leq z3 \leq 0.120$, and $0.075 < t \leq 0.185$); and
   a glass component containing 0.1 weight percent or more of $B_2O_3$ in an amount of 0.05 to 20 weight parts with respect to 100 weight parts of said main composition.

2. The dielectric composition of claim 1, wherein said glass component is selected from the group consisting of $ZnO\text{—}B_2O_3\text{—}SiO_2$, $ZnO\text{—}Bi_2O_3\text{—}B_2O_3\text{—}SiO_2$, $B_2O_3\text{—}SiO_2\text{—}$, $RO\text{—}B_2O_3\text{—}SiO_2$, $GeO_2\text{—}B_2O_3$, $GeO_2\text{—}B_2O_3\text{—}SiO_2$, $GeO_2\text{—}ZnO\text{—}B_2O_3\text{—}SiO_2$, $GeO_2\text{—}ZnO\text{—}B_2O_3$, $Li_2O\text{—}Al_2O_3\text{—}SiO_2\text{—}B_2O_3$, $Li_2O\text{—}Al_2O_3\text{—}SiO_2\text{—}ZnO\text{—}B_2O_3$, $RO\text{—}Li_2O\text{—}Al_2O_3\text{—}SiO_2\text{—}B_2O_3$, $RO\text{—}Li_2O\text{—}Al_2O_3\text{—}SiO_2\text{—}ZnO\text{—}B_2O_3$, $Re_2O\text{—}B_2O_3\text{—}SiO_2$, $Re_2O\text{—}B_2O_3\text{—}ZnO\text{—}SiO_2$, $Re_2O\text{—}RO\text{—}B_2O_3\text{—}SiO_2$ glass, and $Re_2O\text{—}RO\text{—}B_2O_3\text{—}ZnO\text{—}SiO_2$ glass, wherein Re represents an alkali metal and R represents an alkali earth metal.

3. The dielectric composition of claim 2, wherein said glass component comprises a $ZnO\text{—}B_2O_3\text{—}SiO_2$ glass component having a composition of k (weight %) $ZnO$.m (weight %) $B_2O_3$.n (weight %) $SiO_2$ ($10 \leq k \leq 85$, $5 \leq m \leq 50$, $2 \leq n \leq 60$, and k+m+n=100).

4. The dielectric composition of claim 1, comprising at least one metal element selected from the group consisting of Ag, Cu and Ni in a total amount of 5 weight percent or lower.

5. The dielectric composition of claim 1, comprising at least one metal oxide selected from the group consisting of CuO, $V_2O_5$ and $WO_3$.

6. An electronic part comprising said dielectric composition of claim 1.

7. The electronic part of claim 6 being comprising a laminate type dielectric filter.

8. A dielectric composition for firing at low temperatures comprising:
   a main composition of $x.BaO\text{-}y.TiO_2\text{-}z1.Nd_2O_3\text{-}z2.La_2O_3\text{-}z3.Sm_2O_3\text{-}t.Bi_2O_3$ (x+y+z1+z2+z3+t=1, $0.070 \leq x \leq 0.300$, $0.385 \leq y \leq 0.844$, $0.010 \leq z1 \leq 0.130$, $0.000 \leq z2 \leq 0.120$, $0.000 \leq z3 \leq 0.120$, and $0.075 < t \leq 0.185$); and
   $B_2O_3$ in an amount of 0.05 to 10 weight parts with respect to 100 weight parts of said main composition.

9. The dielectric composition of claim 8, comprising at least one metal element selected from the group consisting of Ag, Cu and Ni in a total amount of 5 weight percent or lower.

10. The dielectric composition of claim 8, comprising at least one metal oxide selected from the group consisting of CuO, $V_2O_5$ and $WO_3$.

11. An electronic part comprising said dielectric composition of claim 8.

12. The electronic part of claim 11 comprising a laminate type dielectric filter.

13. A dielectric composition for firing at low temperatures comprising:
   a main composition of $x.BaO\text{-}y.TiO_2\text{-}z1.Nd_2O_3\text{-}z2.La_2O_3\text{-}z3.Sm_2O_3\text{-}t.Bi_2O_3$ (x+y+z1+z2+z3+t=1, $0.100 \leq x \leq 0.250$, $0.600 \leq y \leq 0.750$, $0.010 \leq z1 \leq 0.120$, $0.000 \leq z2 \leq 0.120$, $0.000 \leq z3 \leq 0.120$, $0.010 \leq (z1+z2+z3) \leq 0.120$, $0.065 \leq t \leq 0.075$, and $0.35 \leq t/(z1+z2+z3+t)$); and
   a glass component containing at least 0.1 weight percent of $B_2O_3$ in an amount of 0.05 to 20 weight parts with respect to 100 weight parts of said main composition.

14. The dielectric composition of claim 13, wherein said glass component is selected from the group consisting of $ZnO\text{—}B_2O_3\text{—}SiO_2$, $ZnO\text{—}Bi_2O_3\text{—}B_2O_3\text{—}SiO_2$, $B_2O_3\text{—}SiO_2$, $RO\text{—}B_2O_3\text{—}SiO_2$, $GeO_2\text{—}B_2O_3$, $GeO_2\text{—}B_2O_3\text{—}SiO_2$, $GeO_2\text{—}ZnO\text{—}B_2O_3\text{—}SiO_2$, $GeO_2\text{—}ZnO\text{—}B_2O_3$, $Li_2O\text{—}Al_2O_3\text{—}SiO_2\text{—}B_2O_3$, $Li_2O\text{—}Al_2O_3\text{—}SiO_2\text{—}ZnO\text{—}B_2O_3$, $RO\text{—}Li_2O\text{—}Al_2O_3\text{—}SiO_2\text{—}B_2O_3$, $RO\text{—}Li_2O\text{—}Al_2O_3\text{—}SiO_2\text{—}ZnO\text{—}B_2O_3$, $Re_2O\text{—}B_2O_3\text{—}SiO_2$, $Re_2O\text{—}B_2O_3\text{—}ZnO\text{—}SiO_2$, $Re_2O\text{—}RO\text{—}B_2O_3\text{—}SiO_2$, and $Re_2O\text{—}RO\text{—}B_2O_3\text{—}ZnO\text{—}SiO_2$ glass, wherein Re represents an alkali metal and R represents an alkali earth metal.

15. The dielectric composition of claim 14, wherein said glass component comprises a of $ZnO\text{—}B_2O_3\text{—}SiO_2$ glass component having a composition of k(weight %) $ZnO$.m(weight %) $B_2O_3$.n(weight %) $SiO_2$, ($10 \leq k \leq 85$, $5 \leq m \leq 50$, $2 \leq n \leq 60$, and k+m+n=100).

16. The dielectric composition of claim 13, comprising at least one metal element selected from the group consisting of Ag, Cu and Ni in a total amount of 5 weight percent or lower.

17. The dielectric composition of claim 13, comprising at least one metal oxide selected from the group consisting of CuO, $V_2O_5$ and $WO_3$.

18. An electronic part comprising said dielectric composition of claim 13.

19. The electronic part of claim 18 comprising a laminate-type dielectric filter.

20. A dielectric composition for firing at low temperatures comprising:
   a main composition of $x.BaO\text{-}y.TiO_2\text{-}z1.Nd_2O_3\text{-}z2.La_2O_3\text{-}z3.Sm_2O_3\text{-}t.Bi_2O_3$ (x+y+z1+z2+z3+t=1, $0.100 \leq x \leq 0.250$, $0.600 \leq y \leq 0.750$, $0.010 \leq z1 \leq 0.120$, $0.000 \leq z2 \leq 0.120$, $0.000 \leq z3 \leq 0.120$, $0.010 \leq (z1+z2+z3) \leq 0.120$, $0.065 \leq t \leq 0.075$, and $0.35 \leq t/(z1+z2+z3+t)$); and
   $B_2O_3$ in an amount of 0.05 to 10 weight parts with respect to 100 weight parts of said main composition.

21. The dielectric composition of claim 20, comprising at least one metal element selected from the group consisting of Ag, Cu and Ni in a total amount of 5 weight percent or lower.

22. The dielectric composition of claim 20, comprising at least one metal oxide selected from the group consisting of CuO, $V_2O_5$ and $WO_3$.

23. An electronic part comprising said dielectric composition of claim 20.

24. The electronic part of claim 23 comprising a laminate type dielectric filter.

25. The dielectric composition of claim 1, wherein said main composition is represented by $x.BaO\text{-}y.TiO_2\text{-}z1.Nd_2O_3\text{-}z2.La_2O_3\text{-}z3.Sm_2O_3\text{-}t.Bi_2O_3$ (x+y+z1+z2+z3+

$t=1$, $0.070 \leq x \leq 0.300$, $0.385 \leq y \leq 0.844$, $0.010 \leq z1 \leq 0.130$, $0.000 \leq z2 \leq 0.120$, $0.000 \leq z3 \leq 0.120$, and $0.0751 \leq t \leq 0.185$).

26. The dielectric composition of claim 1, wherein said main composition is represented by $x.BaO\text{-}y.TiO_2\text{-}z1.Nd_2O_3\text{-}z2.La_2O_3\text{-}z3.Sm_2O_3\text{-}t.Bi_2O_3$ ($x+y+z1+z2+z3+t=1$, $0.070 \leq x \leq 0.300$, $0.385 \leq y \leq 0.844$, $0.010 \leq z1 \leq 0.130$, $0.000 \leq z2 \leq 0.120$, $0.000 \leq z3 \leq 0.120$, and $0.0752 \leq t \leq 0.185$).

27. The dielectric composition of claim 1, wherein said main composition is represented by $x.BaO\text{-}y.TiO_2\text{-}z1.Nd_2O_3\text{-}z2.La_2O_3\text{-}z3.Sm_2O_3\text{-}t.Bi_2O_3$ ($x+y+z1+z2+z3+t=1$, $0.070 \leq x \leq 0.300$, $0.385 \leq y \leq 0.844$, $0.010 \leq z1 \leq 0.130$, $0.000 \leq z2 \leq 0.120$, $0.000 \leq z3 \leq 0.120$, and $0.076 \leq t \leq 0.185$).

28. The dielectric composition of claim 8, wherein said main composition is represented by $x.BaO\text{-}y.TiO_2\text{-}z1.Nd_2O_3\text{-}z2.La_2O_3\text{-}z3.Sm_2O_3\text{-}t.Bi_2O_3$ ($x+y+z1+z2+z3+t=1$, $0.070 \leq x \leq 0.300$, $0.385 \leq y \leq 0.844$, $0.010 \leq z1 \leq 0.130$, $0.000 z2 \leq 0.120$, $0.000 \leq z3 \leq 0.120$, and $0.0751 \leq t \leq 0.185$).

29. The dielectric composition of claim 8, wherein said main composition is represented by $x.BaO\text{-}y.TiO_2\text{-}z1.Nd_2O_3\text{-}z2.La_2O_3\text{-}z3.Sm_2O_3\text{-}t.Bi_2O_3$ ($x+y+z1+z2+z3+t=1$, $0.070 \leq x \leq 0.300$, $0.385 \leq y \leq 0.844$, $0.010 \leq z1 \leq 0.130$, $0.000 \leq z2 \leq 0.120$, $0.000 \leq z3 \leq 0.120$, and $0.0752 \leq t \leq 0.185$).

30. The dielectric composition of claim 8, wherein said main composition is represented by $x.BaO\text{-}y.TiO_2\text{-}z1.Nd_2O_3\text{-}z2.La_2O_3\text{-}z3.Sm_2O_3\text{-}t.Bi_2O_3$ ($x+y+z1+z2+z3+t=1$, $0.070 \leq x \leq 0.300$, $0.385 \leq y \leq 0.844$, $0.010 \leq z1 \leq 0.130$, $0.000 \leq z2 \leq 0.120$, $0.000 \leq z3 \leq 0.120$, and $0.076 \leq t \leq 0.185$).

* * * * *

UNITED STATES PATENT AND TRADEMARK OFFICE
CERTIFICATE OF CORRECTION

| | | |
|---|---|---|
| PATENT NO. | : 7,091,147 B2 | Page 1 of 1 |
| APPLICATION NO. | : 10/787855 | |
| DATED | : August 15, 2006 | |
| INVENTOR(S) | : Takeshi Oobuchi and Tadashi Otagiri | |

It is certified that error appears in the above-identified patent and that said Letters Patent is hereby corrected as shown below:

Title Page
  Please add Item (30) Foreign Application Priority Data:
    Mar. 4, 2003 (JP) ............ 2003-056718
    Dec. 17, 2003 (JP) ............... 2003-420051

Please amend Item (57) Abstract as follows:
    *Line 10*: delete "or more"

Column 17
  *Line 50*: please delete "being"

Column 18
  *Line 29*: please delete "of"

Column 20
  *Line 3*: please delete "0.000z2≤0.120" and add --$0.000 \leq z2 \leq 0.120$--

Signed and Sealed this

Twenty-eighth Day of November, 2006

JON W. DUDAS
*Director of the United States Patent and Trademark Office*